METHOD OF MAKING SEMICONDUCTOR DEVICE

Original Filed June 26, 1967 2 Sheets-Sheet 1

INVENTORS
TSUNEO KAWASHIMA
KENJI OHMORI

BY

[signature]
ATTORNEY

INVENTORS
TSUNEO KAWASHIMA
KENJI OHMORI
BY
[signature]
ATTORNEY 3,592,705

METHOD OF MAKING SEMICONDUCTOR DEVICE

Tsuneo Kawashima, Tokyo, and Kenji Ohmori, Atsugi-shi, Japan, assignors to Sony Corporation, Tokyo, Japan Original application June 26, 1967, Ser. No. 648,694. Divided and this application May 2, 1969, Ser. No. 843,252
Int. Cl. H01l 7/34
U.S. Cl. 148—187 6 Claims

ABSTRACT OF THE DISCLOSURE

This invention relates generally to semiconductor devices, and more particularly to a diffusion-type transistor and a method of making the same. Instead of using a photosensitive material to coat the semiconductor substrate the mark is formed of an etchant-proof material, such as wax. The $N^+$ and $P^+$ impurities are also simultaneously diffused.

This is a division of application Ser. No. 648,694, filed June 26, 1967, now abandoned.

DESCRIPTION OF THE PRIOR ART

Conventional method of making diffusion-type transistors usually employ a photosensitive material such as commercially known under the name of KPR (Kodak Photo Resist) or the like. However, such photosensitive materials are not resistant to chemicals of the hydrofluoric acid series, and hence the material is eroded by the chemicals during the long manufacturing processes. This prevents satisfactory manufacturing operations and consequently deteriorates the characteristics of the finished transistors. Further, since the glass mask used with the KPR material has optical defects such as stains or the like, a pin hole, a recess or a thin portion is formed in the KPR layer, which are undesirable for the production of the transistors.

SUMMARY OF THE INVENTION

The primary object of the present invention is to form a diffusion-type transistor without using a photosensitive material such as KPR material or the like, the transistor thereby being free from the defects usually resulting from the use of a photosensitive material.

Another object of the present invention is to provide a diffusion-type transistor having excellent electrical characteristics.

Other objects, features and advantages of the present invention will become apparent from the following detailed description of the invention which is to be read in conjunction with the accompanying drawings wherein like components in the several views are identified by the same reference numeral.

DESCRIPTION OF THE PREFERRED EMBODIMENTS

Figure 1:
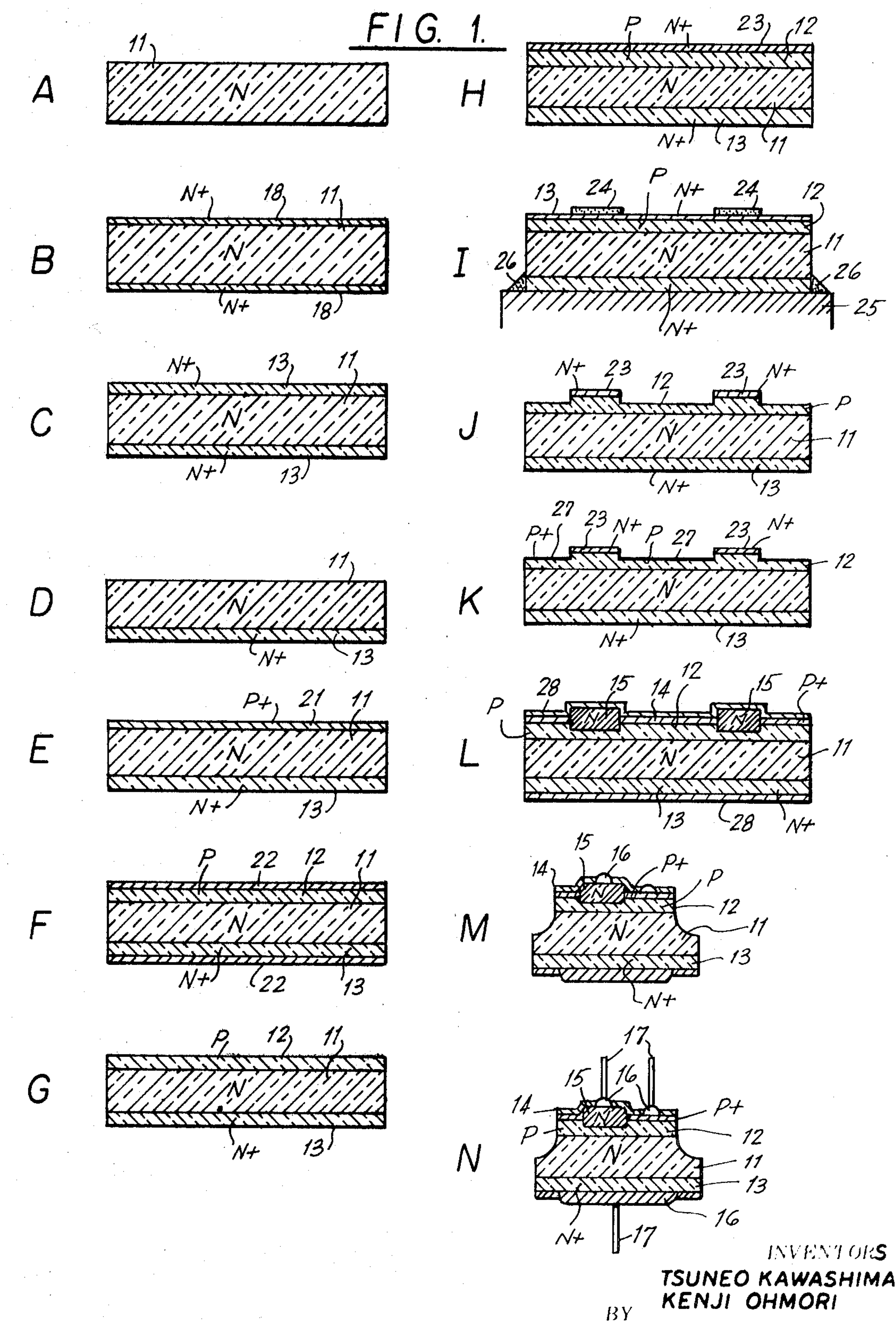
FIGS. 1A to 1M, inclusive, are enlarged cross-sectional drawings schematically illustrating a sequence of steps involved in the process of making a diffusion-type transistor in accordance with the present invention.
FIG. 1N is an enlarged cross-sectional view schematically illustrating the diffusion-type transistor produced in accordance with the present invention.

Referring to FIG. 1N there is illustrated a diffusion-type transistor formed in accordance with the present invention which comprises a first (or collector) region 11 of one conductivity, for example, N-type conductivity, a second (or base) region 12 of the other conductivity, namely P-type conductivity which overlies the first region 11, a third (or collector) region 13 of the same conductivity type as that of the first region 11, but higher in concentration (as indicated by the designation $N^+$) and which underlies the first region 11, a fourth (or base) region 14 of the same conductivity type as that of the second region 12, but higher in concentration (as indicated by the designation $P^+$) and which overlies the second region 12, and a fifth (or emitter) region 15 of the same conductivity type as that of the first region 11, which is surrounded by the second and fourth regions 12 and 14 and protrudes through the fourth region 14. The first and third regions 11 and 13 constitute a collector, the second and fourth regions 12 and 14 constitute a base and the first region 15 constitutes an emitter. The reference numeral 16 indicates electrodes and the reference numeral 17 lead wires.

A description will now be given of the method for forming the aforementioned double-mesa type diffusion transistor of the present invention. First, a silicon substrate 11 of the N-type conductivity such as depicted in FIG. 1A is provided which is 250$\mu$ in thickness and 50 ohm. cm. in resistivity, and an impurity 18 is then predeposited on the substrate 1 to form layers of $N^+$-type conductivity as shown in FIG. 1B. Next, the silicon substrate 11 is heated at 1200° C. in an oxygen atmosphere for 30 minutes to diffuse the impurity 18 into the N-type region to form the $N^+$-type layers 13 as depicted in FIG. 1C, after which the upper $N^+$-type layer 13 is removed by mechanical grinding or chemical etching to leave the lower $N^+$-type layer 13 as illustrated in FIG. 1D.

Subsequent to this, an impurity 21 such, for example, as $B_2O_3$ to form a $P^+$-type region is deposited on the N-type region 11 as shown in FIG. 1E, and the silicon substrate is then heated to diffuse the impurity 21 into the N-type region 11 to form a P-type layer 12 as depicted in FIG. 1F. During this step, oxide layers 22 of, for example, $SiO_2$ are formed on the layers 12 and 13 simultaneously with the formation of the P-type layer 12 due to diffusion of the $P^+$-type layer. The oxide layers 22 are removed by the use of hydrofluoric acid or the like as shown in FIG. 1G, after which a doner impurity such as $POCl_3$ is deposited on the P-type layer 12 to form an $N^+$-type layer 23 thereon, as seen in FIG. 1H.

Following this, a mask 24 of an etchant-proof material such as, for instance, wax is deposited on the $N^+$-type layer 23 through the use of, for example, a metal mask or the like, and the entire substrate is then mounted on a plate 25 and is covered with wax 26 around the lower $N^+$-type layer 13, as illustrated in FIG. 11. The wax 26 is, for example, "APIEZON WAX (W–40)" mingles with paraffin.

The substrate thus treated is then subjected to mesa-etching, as depicted in FIG. 1J, which can be accomplished in any well known manner by use of a mixed solution of, for example, hydrofluoric acid with nitric acid, a mixed solution of hydrofluoric acid with nitric acid and acetic acid or a like solution. After the mesa-etching, the mask 24 is removed to expose the $N^+$-type layer 23 of the donor impurity and an acceptor impurity such as $B_2O_3$ is deposited on the surface of the P-type region 12 to form a $P^+$-type layer 27 thereon, as shown in FIG. 1K. The substrate is then heated at a temperature of 1200° C. in an oxygen atmosphere thereby diffusing the impurities 27 into the P-type region 12. This leads to the formation of an N-type layer 15 and a $P^+$-type layer 14 in the P-type region 12 and the simultaneous formation of oxide layers 28 of $SiO_2$ on the upper and lower surfaces of the substrate, as seen from FIG. 1L.

Next, the oxide layers 28 are selectively removed by a sand blast method of nickel-layer electrodes 16 are deposited, by electrolytic or electroless plating, on those areas from which the oxide layers 28 have been selectively removed and the electrodes 16 are soldered. The solder may be such as Pb+Sn or Pb+Sn+Ag. Prior to connecting the lead wires 17 to the solder, a mesa-etching is carried out through a suitable mask of wax. The resulting substrate is subjected to the so-called "pelletize-etching" and is then severed into individual elements for double-mesa type diffusion transistors. FIG. 1M illustrates the transistor element produced as above described. The lead wires and other mountings are then attached to the transistor element to complete such a transistor as shown in FIG. 1N.

The conventional methods of making diffusion-type transistors usually employ an oxide layer as a mask in the diffusion processes but it is very difficult to form a perfect oxide layer as has been described in the foregoing. Due to imperfections in the oxide layer, so-called "punch through" or "piping" phenomenon occur, which greatly lowers the electrical characteristics of the transistor. These phenomenon are regarded as almost impossible to prevent. According to the present invention, however, a mask of wax is used in the process of the mesa-etching shown in FIGS. 1I and 1J. Accordingly, the present invention avoids the "punch through" or "piping" phenomenon which could not have been avoided hitherto and, accordingly, eliminates the defects resulting therefrom.

Figure 2:
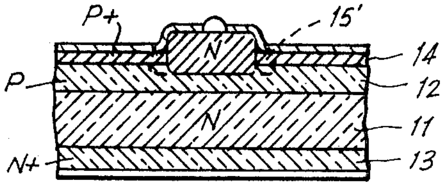
FIG. 2 is an enlarged schematic diagram of one portion of the transistor of the present invention.

Further, in this invention the $N^+$- and $P^+$-type impurities are diffused simultaneously in the processes shown in FIGS. 1K and 1L but in this case, if the $P^+$-type impurity is not diffused into the base 12, inverse diffusion takes place from the emitter N to the position of the $P^+$-type impurity, and further an unfavorable phenomenon such as the so-called "out diffusion" occurs to cause the $P^+$-type region to be of N-type locally. That is, there is a possibility that an N-type region 15' such as shown by the dotted line in FIG. 2 is formed. According to this invention, however, since the $P^+$-type layer is formed, such a non-uniform emitter region as indicated by the broken line 15' is not produced and its junction is very uniform. Further, in this case the $P^+$-type base region is formed, and hence the resistance of that portion of the base region becomes lowered, which serves to enhance the electrical characteristics such as higher breakdown voltage and the like, coupled with the uniform junction between the N- and $P^+$-type regions of the $P^+$-type, the concentration of the N-type impurity that enters into the $P^+$-type is low but the resistance is high. Therefore, the so-called base resistance becomes low and the hFe–Ic characteristics are improved to thereby enhance the linearity of the so-called hFe characteristic and hence improve the amplification efficiency.

Figure 3:
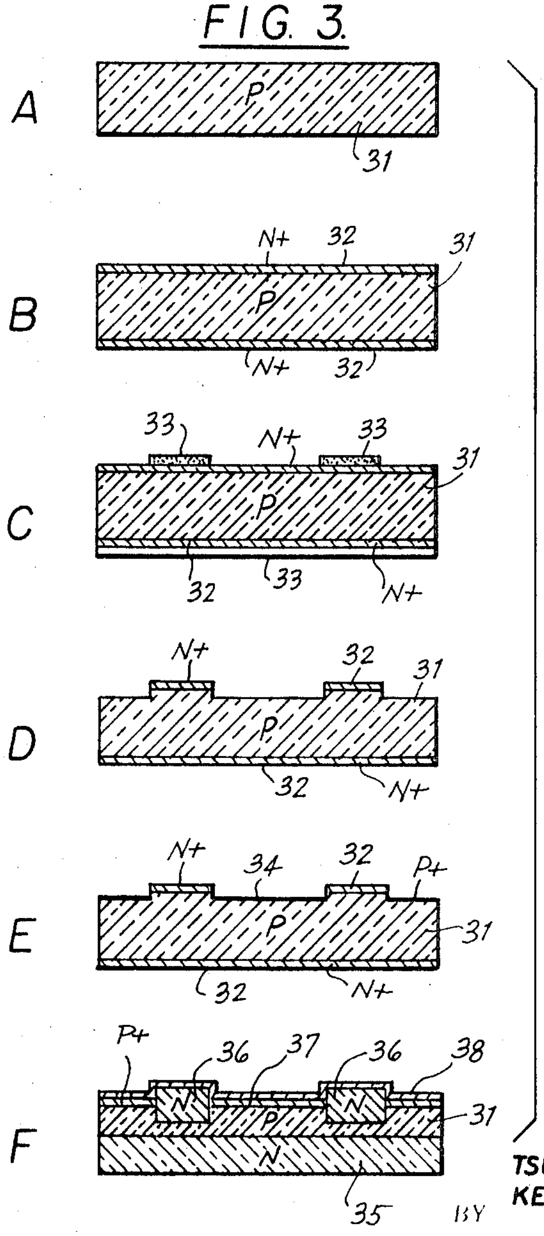
FIGS. 3A to 3F, inclusive, are enlarged cross-sectional drawings schematically illustrating another embodiment of the present invention.

Referring now to FIGS. 3A to 3F, another example of this invention will hereinafter be described. A P-type silicon substrate 31 having a thickness of, for example, $120\mu$ is first provided, as shown in FIG. 3A. Then, a donor impurity such as, for example, $POCl_3$ is predeposited on the silicon substrate 31, after which the silicon substrate 31 is heated at 1200° C. in an oxygen atmosphere to diffuse the impurity into the P-type region, forming an $N^+$-type layer 32, as illustrated in FIG. 3B. Following this, an etchant-proof wax 33 such, for example, as "APIEZON WAX (W–40)" is coated on the entire area of the underface and on selected areas of the upper surface of the silicon substrate 31, forming masks for etching use, as depicted in FIG. 3C. The silicon substrate 31 is then subjected to an etching process to form a mesa of a height of $15\mu$ and the wax is removed, as illustrated in FIG. 3D. After removal of the wax, an acceptor impurity, for example, $B_2O_3$ is pre-deposited on the substrate 31 in an $N_2$ atmosphere to form a $P^+$-type layer 34, as depicted in FIG. 3E. The substrate 31 is heated at a temperature of 1200° C. in an oxygen atmosphere for 80 hours, resulting in the formation of an N-type collector region 35, an N-type emitter region 36 and a $P^+$-type layer 37 on the base region 31, as shown in FIG. 3F. Reference numeral 38 indicates a $SiO_2$ layer formed in the diffusion process. After this, the same processes as in the foregoing example are carried out, so that no description will be given thereon for the sake of brevity.

According to this method, the collector 35 is formed simultaneously with the formation of the emitter 36 and the $P^+$-type layer 37 on the base region 31, and this facilitates manufacturing of the transistors.

Conventional methods usually employ a photosensitive material such as KPR or the like in the process of selective diffusion but in this case the photosensitive material is likely to be eroded by the chemicals used and since the photosensitive material is very thin, it is eroded by the chemicals particularly in the mesa etching process by which the substrate is deeply etched. However, since the present invention employs an etching-proof material such, for example, as wax, as above described, the material is scarcely eroded by the chemicals and hence the use of a mask made from such a material eliminates the difficulty experienced in the prior art. Further, the mesa construction by the second mesa etching causes an increase in the breakdown voltage between the collector and base and the breakdown voltage characteristic becomes sharp, so that the breakdown voltage can be increased without causing leakage.

It will be apparent that many modifications and variations may be effected without departing from the scope of the novel concepts of this invention.

We claim:

1. A method for making a semiconductor device from a semiconductor substrate having first and second conductivity layers of different conductivity, said method comprising the steps of depositing a first impurity layer of said first conductivity type on said second conductivity layer, selectively removing said first impurity layer and the surface of said second conductivity layer to form a mesa, depositing a second impurity layer of said second conductivity type on all portions of said second conductivity layer except said mesa portion, and simultaneously diffusing said first and second impurities into said second conductivity layer to form third and fourth layers.

2. A method for making a semiconductor device from a semiconductor substrate having first and second conductivity layers of different conductivity, said method comprising the steps of depositing a first impurity layer of said first conductivity type on said second conductivity layer, selectively covering said first impurity layer with an etchant-proof material, removing said first impurity layer not covered by said etchant-proof material to form a mesa, depositing a second impurity layer of said second conductivity type on all portions of said second conductivity layer except said mesa portion, and simultaneously diffusing said first and second impurities into said second conductivity layer to form third and fourth layers.

3. A method in accordance with claim 2 wherein said first impurity layer is removed by etching.

4. A method in accordance with claim 2 wherein said first conductivity layer has formed therein on the side opposite from the second conductivity layer, a layer of the same conductivity type as said first layer but of a higher impurity concentration.

5. A method in accordance with claim 4 wherein said etchant-proof material is wax.

6. A method for making a semiconductor device from a semiconductor substrate having first and second conductivity layers of different conductivity, said method comprising the steps of depositing a first impurity layer of said first conductivity type on said second conductivity layer, selectively covering said first impurity layer with a mask of an etchant-proof wax material, removing by etching said portions of said first impurity layer not covered by said wax to form a mesa, depositing a second impurity layer of said second conductivity type on all portions of said second conductivity layer except said mesa portion, and simultaneously diffusing said first and second impurities into said second conductivity layer to form third and fourth layers.

References Cited

UNITED STATES PATENTS

| | | | |
|---|---|---|---|
| 3,275,482 | 9/1966 | Meer | 140—185 |
| 3,311,963 | 4/1967 | Abe | 148—186 |

L. DEWAYNE, RUTLEDGE, Primary Examiner

R. A. LESTER, Assistant Examiner

U.S. Cl. X.R.

148—186, 188, 189; 317—235